United States Patent
Sturm et al.

(10) Patent No.: US 6,300,756 B2
(45) Date of Patent: *Oct. 9, 2001

(54) MICRO-MECHANICAL PROBES FOR CHARGE SENSING

(75) Inventors: James C. Sturm, Skillman; Kiran Pangal, Princeton, both of NJ (US); Samara L. Firebaugh, Cambridge, MA (US)

(73) Assignee: The Trustees of Princeton University, Princeton, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/873,819

(22) Filed: Jun. 12, 1997

Related U.S. Application Data

(60) Provisional application No. 60/019,658, filed on Jun. 12, 1996.

(51) Int. Cl.[7] .................................................. G01R 29/12
(52) U.S. Cl. ............................. 324/109; 324/457
(58) Field of Search ..................... 324/109, 452, 324/457, 454, 458, 765

(56) References Cited

U.S. PATENT DOCUMENTS

| | | | |
|---|---|---|---|
| 3,317,983 | * 5/1967 | De Wit | 324/109 |
| 4,614,908 | * 9/1986 | Daniele et al. | 324/458 |
| 4,625,176 | * 11/1986 | Champion et al. | 324/458 |
| 4,835,461 | * 5/1989 | Snelling | 324/109 |
| 5,517,123 | * 5/1996 | Zhao et al. | 324/458 |

OTHER PUBLICATIONS

Murakawa et al, "Mechanism of Surface Charging Effects On Etching Profile Defects", Jpn. J. Appl. Phys, vol. 33, Apr. (1994) pp. 2184–2188.

Lukaszek, et al., "Claim 2: Towards an Industry–Standard Wafer Surface–Charge Monitor", IEEE/SEMI Advanced Semiconductor Manufacturing Conference (1992) pp 148–152 (month unavailable).

Lukaszek, "Characterization of Wafer Charging in ECR Etching", $2^{nd}$ International Symposium on Plasma Process–Induced Damage May (1997), pp. 119–122.

Murakawa et al., "Direct Measurement of Surface Charging during Plasma Etching", Jpn. J. Appl. Phys. vol. 33 May (1994) pp. 4446–4449.

* cited by examiner

*Primary Examiner*—Glenn W. Brown
(74) *Attorney, Agent, or Firm*—Wolff & Samson

(57) ABSTRACT

A method and apparatus for measuring a charge on a surface, such as on a semiconductor wafer, arising during plasma processing is provided. Such a charge may be measured on an insulating film applied to such a wafer. By the present invention, the charge on such an insulator exposed to plasma is measured in-situ using micro-cantilevers. The micro-cantilevers include an insulating base positioned on the substrate and a cantilevered beam extending therefrom to over the substrate. The beam is formed of a conductive material. A charge on the beam causes an opposite charge to form on the substrate. The opposite charges attract to move or deflect the beam towards the substrate. The amount of movement or deflection corresponds to the magnitude of the charge. This movement or deflection of the beam can be measured to determine the charge by bouncing a light source, such as a laser, off of the beam. In another embodiment, the cantilever includes a flexible bridge interconnected between the base and a rigid beam. In this embodiment, the surface of the beam does not bend. Rather, movement of the beam is accomplished by the bending of the flexible bridge. This allows for easier measurements of the movement of the beam because the surface of the beam remains planar.

21 Claims, 10 Drawing Sheets

MICRO-MECHANICAL PROBES FOR CHARGE SENSING

RELATED APPLICATIONS

This application claims the benefit of U.S. Provisional Patent Application Ser. No. 60/019,658, filed Jun. 12, 1996.

BACKGROUND OF THE INVENTION

1. Field of the Invention

This invention relates generally to a method and apparatus for measuring an electrical charge on a surface, and more particularly to a system of one or more micro-cantilevers for measuring charges on a surface layer on a substrate during semiconductor processing on semiconductor wafers.

2. Related Art

Plasmas are widely used in the semiconductor industry for processing to delineate fine line pattern and deposition at low temperature, e.g. plasma etching. During plasma exposure the wafer is exposed to a bombardment of ions, electron, photons, and x-rays which can lead to a charge build-up on the semiconductor device. Such a charge build-up, known as wafer surface charging, can degrade or destroy the device. If such charges develop, a voltage can develop which could cause irreversible damage to the device, especially metal oxide semi conductor (MOS) gate dielectrics. In recent years, it has been reported that plasma non-uniformity across the wafer is the predominant cause of charging. This non-uniformity can arise from non-uniformities in RF current flow, electron current flow, and ion current flow. Such charging can also arise from handling and/or cleaning a semiconductor device. These problems are becoming more important as gate oxides become thinner, and hence, more vulnerable to surface charging.

It would be beneficial to measure in situ, in a plasma reactor, the charge on a wafer to determine the magnitude of such charges occurring during the manufacturing process. This could lead to improved manufacturing processes. Additionally, if one could measure the charge on a wafer that occurred during the manufacturing process, one may be able to use such measurement as a quality control means, i.e. by discarding chips have too great a charge and therefore, a high likelihood of damage.

Previous efforts in this area have not yielded a suitable method and apparatus for measuring a charge on a wafer during the manufacturing process. One way that has been used in the past to obtain measurements of charge is to attach leads directly to a specimen. Another way of determining charge is to measure degradation of the transistor after processing. Such previous efforts include:

Murakawa, et al., "Mechanism of Surface Charging Effects on etching Profile Defects," Jpn. J. Appl. Phys., Vol 33 (1994) discloses using a magnet placed under a grounded electrode to create a magnetic field at the wafer center. A probe measures the plasma potential along the wafer. The probe comprises a silicon wafer with an Al pad with contacts leading to Cu wires extending out of the chamber to RF chokes and low-pass filters and then to a DC voltmeter. This is not an elegant solution as it requires fishing wires in and out of the reactor chamber.

Another commercially available method of measuring charge comprises a detection device which can be employed outside the reactor chamber after processing of a device is complete. However, this solution is not entirely satisfactory because it measures an accumulated affect over the total processing time and cannot provide specific information about charge development during processing.

None of these previous efforts teach or suggest all of the elements of the present invention, nor do any disclose the benefits and utility of the invention.

OBJECTS AND SUMMARY OF THE INVENTION

It is a primary object of the present invention to provide a method and apparatus for measuring charge on a surface.

It is another object of the present invention to provide a method and apparatus for measuring the charged caused by plasma processing of a semi-conductor wafer.

It is another object of the present invention to provide microscopic cantilevers for use in measuring a charge on a surface.

It is an additional object of the present invention to provide a method and apparatus for measuring charge on a semi-conductor surface in situ.

It is even an additional object of the present invention to provide means for measuring charge on a surface by measuring deflection of a cantilever beam.

It is still even an additional object of the present invention to provide a means for measuring a charge on a surface wherein a rigid beam is connected to a flexible bridge so that the surface of the beam does not bend during deflection of the device.

It is still even a further object of the present invention to provide a means for measuring charge on a surface which can map charging across an electrode.

It is still another object of the present invention to utilize a plurality of micro-cantilevers on a wafer to measure surface charging.

It is a further object of the present invention to provide test wafers comprising a plurality of probes for experimental use.

It is also an object of the present invention to provide probes on wafers in combination with actual circuits of chips, which probes do not affect chip performance.

The present invention provides a method and apparatus for measuring a charge on a surface, such as on a semiconductor wafer, arising during plasma processing. Accordingly, such a charge may be measured on an insulating film applied to such a wafer. By the present invention, the charge on such an insulator exposed to plasma is measured in-situ, within the plasma reactor, using microcantilevers. The micro-cantilevers include an insulating base positioned on the substrate and a cantilevered beam extending therefrom to over the substrate. The beam is formed of a conductive material. Processing can cause external charges to occur on the beam. A charge on the beam causes an opposite charge to form on the substrate. The opposite charges attract to move or deflect the beam towards the substrate. The amount of movement or deflection corresponds to the magnitude of the charge. This movement or deflection of the beam can be measured to determine the charge by bouncing a light source, such as a laser, off of the cantilevered beam. Alternatively, measuring charge can be performed by allowing the beams to deflect to the point of contact with substrate wherein they stick to the substrate, and the beams can be later inspected to determine charge. In another embodiment, the cantilever includes a flexible bridge interconnected between the base and a rigid beam. In this embodiment, the surface of the beam does not bend. Rather, movement of the beam is accomplished by the bending of the flexible bridge. This allows for easier measurements of the movement of the beam because the surface of the beam remains planar.

BRIEF DESCRIPTION OF THE DRAWINGS

Other important objects and features of the invention will be apparent from the following Detailed Description of the Invention taken in connection with the accompanying drawings in which.

DETAILED DESCRIPTION OF THE INVENTION

Figure 1A:
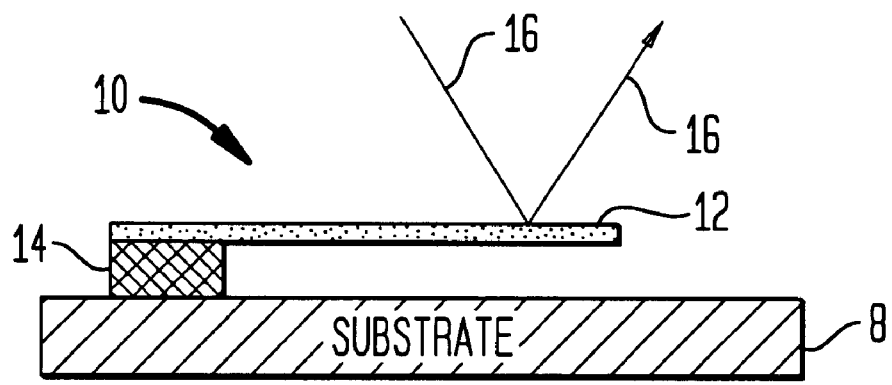
FIGS. 1a and 1b show schematic views of a cantilever charge sensing structure in undeflected, and deflected states, respectively, of one embodiment of the invention.
Figure 1B:
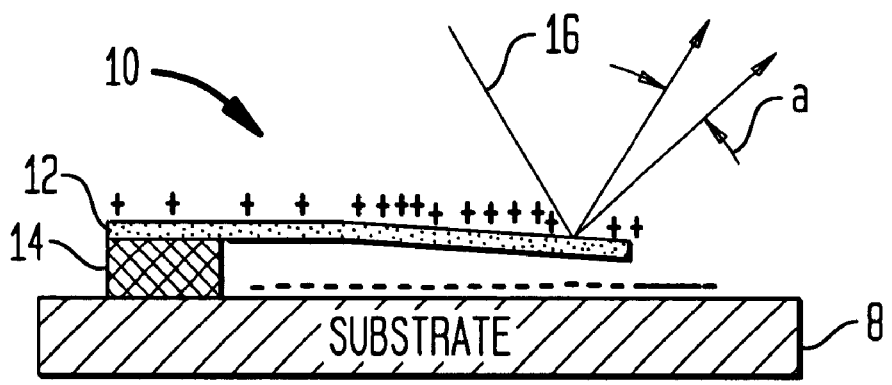

Referring to FIG. 1a, a microscopic cantilever ("microcantilever"), generally indicated at 10, comprises a beam 12 supported above a substrate 8, by means of an insulator 14 positioned at one end of the beam 12. The insulator 14 electrically isolates the beam 12 from the substrate 8. The beam 12 is formed of a conducting material and acts as a charge-sensing structure. If an interaction with plasma or fluid adds electrons or ions to the surface of the beam 12, the micro-cantilever 10 becomes charged. The substrate 8 mirrors the charge on the micro-cantilever 10, resulting in an electric field between the micro-cantilever 10 and the substrate 8. This electric field creates a force on the micro-cantilever 10 leading to deflection of the beam 10 as shown in FIG. 1b. The charge on the micro-cantilever 10 can be calculated from the deflection of the beam 12. It should be pointed out that the beam 12 could be supported at both ends thereof, and the deflection could be measured at the center of the beam 12. It is also within the scope of the present invention to replace the beam 12 with panel or membrane, supported at all four corners, and measure deflection at the center thereof.

One way to measure the deflection of the beam 12 is to reflect a light source or beam 16, such as, for example, a laser, off the surface of the deflected beam 12 and onto a screen. As the beam 12 deflects, the reflection of the light source shifts, as shown by angle a, and this shift shows up at the screen The magnitude of deflection, and hence, the magnitude of the charge on the substrate can be determined from this shift. The deflection could also be measured through defraction of a light source based on movement of the beam 12. Another way to measure deflection is to deflect the cantilevered beams far enough to touch the substrate and stick thereto. This is a well-known phenomena in the field of micro-mechanical structures, often referred to as "stiction." By using a plurality of cantilevers of different size and/or rigidity, by examining the "stuck" cantilevered beams, the voltage range can be determined. Deflection could also be measured by capacitance sensing.

Figure 2A:
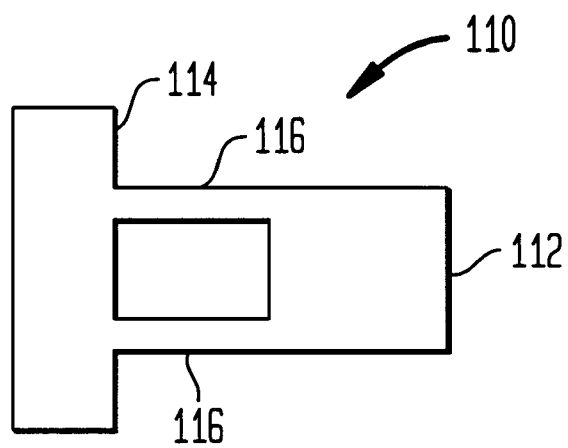
FIGS. 2a and 2b show top and side elevational views of a paddle structure embodiment of the invention.
Figure 2B:
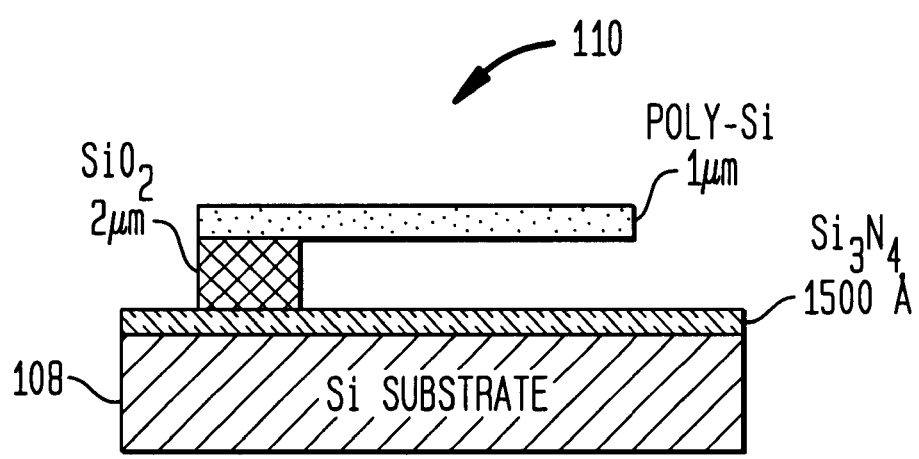

Referring now to FIGS. 2a and 2b, paddle-like structures ("paddles"), generally indicated at 110, can be used. These paddles 110 are more sensitive to electrostatic force than the micro-cantilevers 10, and also have larger reflecting area, so that deflection is easier to detect. The paddles 110 comprise a large pad 112 connected to the support 114 by a flexible bridge comprising thin arms 116. An additional advantage of this structure is that the majority of the distortion occurs in the arms 116, with the pads 112 remaining unbowed. Various sized paddles 110 can be used to detect a particular range of voltage. The paddle 112 could be formed of any desired material such a Poly-Si, while the support 114 could be formed of $SiO_2$.

The paddle structures and the cantilevers are fabricated by standard surface micro-machining technique. The fabrication steps are shown in FIGS. 3a through 3d. $N^+$-type silicon wafers (0.5–2.0 Ω-cm) are used as substrate. First a layer of silicon nitride of thickness 150 nm is deposited by chemical vapor deposition (CVD). This serves to alleviate "stiction" problems during processing. Stiction occurs when the cantilever deflects all the way and sticks to the substrate. The second step involves creating the sacrificial layer which will be isotropically etched to realize free standing structures. In this case a 2 μm thick silicon dioxide ($SiO_2$) layer is deposited by atmospheric pressure CVD. A 1 μm thick polycrystalline silicon layer is then deposited by low-pressure CVD and is doped heavily with phosphorus ($\sim 10^{20}$ $cm^{-3}$) to have high conductivity, and annealed to reduce the internal stress in the polysilicon cantilevers.

Figure 3A:
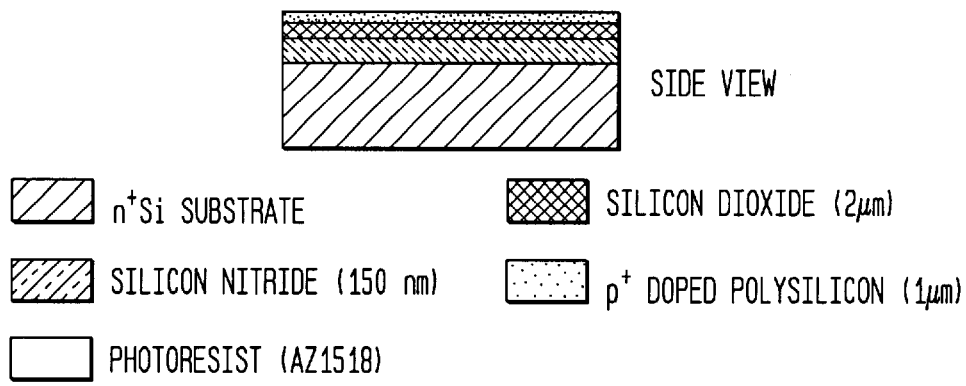
FIGS. 3a through 3d show the main processing steps required for fabricating the paddle structure of FIGS. 2a and 2b, for one embodiment of the invention.
Figure 3B:
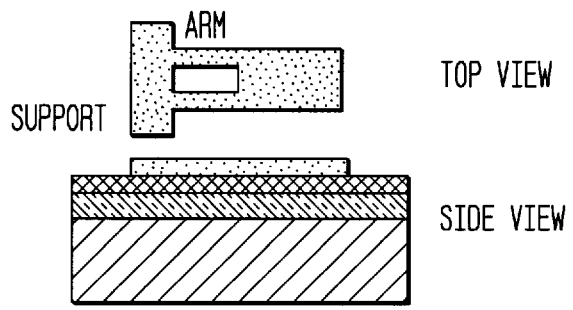
Figure 3C:
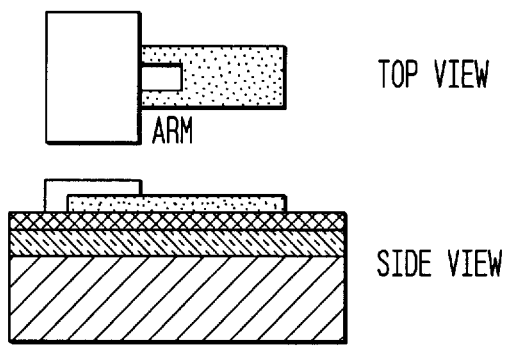
Figure 3D:
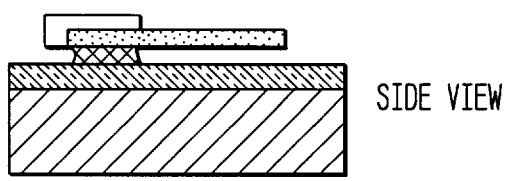

The polysilicon is first dry-etched in $SF_6$ plasma (RF power 30 W, pressure 150 mTorr & flow rate 15 sccm) as shown in FIG. 3b. Next photoresist (AZ1518) is spin-coated on the support structure to prevent the silicon dioxide underneath the support from being etched during the release step (FIG. 3c). The final processing step to create freestanding micro mechanical structures is sacrificial layer etching of $SiO_2$ by buffered hydrofluoric (HF) acid (FIG. 3d). The wafers are then rinsed in deionized water and later in acetone to remove the photoresist. Drying the wafers under atmospheric conditions leads to stiction. Hence, various drying methods were attempted, like vacuum drying and drying the wafer on a hot plate. The second method gave better results. It involved soaking the wafer in pure isopropyl alcohol for 10 min. until the alcohol displaces the water underneath the paddles and then evaporating the alcohol by placing the wafer on a hot plate at 200° C. The reflecting pad areas of the paddles can range from 60 $\mu$m×50 $\mu$m to 30 $\mu$m×50 $\mu$m with arm lengths from 40 $\mu$m to 30 $\mu$m, although other dimensions are within the scope of the invention. The structures preferably have an arm width of 10 $\mu$m. The dimensions of all the paddle structures are designed for a sacrificial layer etch of about four hours.

Figure 4:
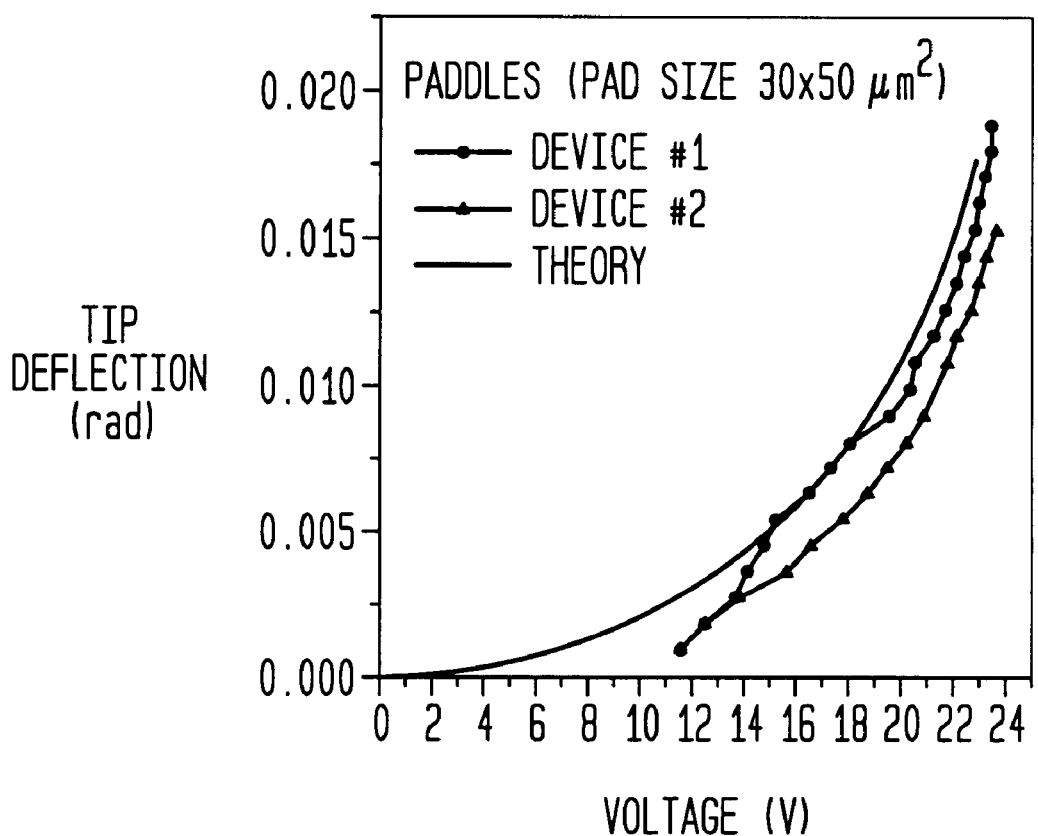
FIG. 4 shows a plot of tip deflection angle as a function of voltage for external calibration of the paddles of FIGS. 2a and 2b.

Prior to exposure to plasma, the devices are externally calibrated by observing the deflection in response to an applied electrical voltage, using a needle probe to apply voltage to the polysilicon on top of the support. FIG. 4 shows the tip deflection angle of the paddle as a function of voltage. Simulations of deflection vs. voltage can be performed by finite difference modeling.

Figure 5:
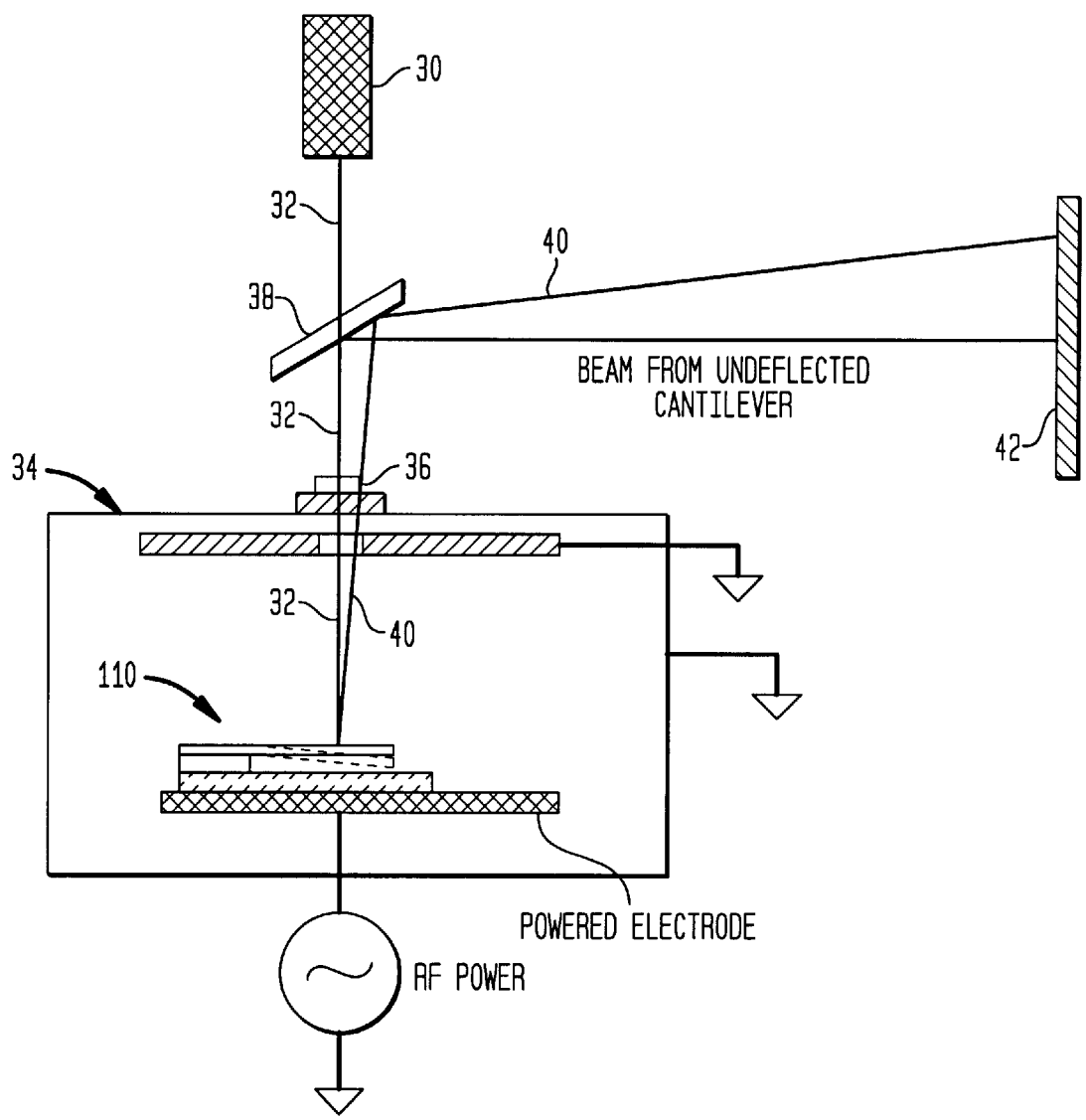
FIG. 5 shows a schematic view of an experimental setup of apparatus used to detect charge in plasma, for detecting reflected laser beams from charged and uncharged cantilevers or paddles.

The schematic of the experimental set-up used to detect charging in situ in the parallel-plate reactor is shown in FIG. 5. A He—Ne laser 30 produces a beam 32 which is directed into the reactor chamber 34 through a quartz window 36 after passing through a beam-splitter 38. The laser beam covers several identical paddles so no focusing is necessary. The reflected light 40 is projected onto a screen 42. When charging occurs, the paddles 110 deflect (dotted lines) leading to a shift in the reflected laser spot on the screen 42. From the tip deflection angle, which can be easily computed from this shift, the charging voltage in the plasma can be determined. The advantage of this technique is that it is direct and gives fairly accurate results (<5% error). But the disadvantage is that it requires an optical port and one cannot measure charging voltage at different parts of the electrode.

During plasma exposure, cantilevers that deflect far enough suffer "pull-in" and touch the substrate. When this occurs they often suffer from "stiction", i.e. they remain stuck after the removal of the charge. This can be quickly detected by external inspection under an optical microscope after the plasma exposure. The charging voltage can be estimated by having a range of paddle sizes with different pull-in voltages on the wafer, and observing which ones have pulled-in. The main advantage of this method is that no optical ports are required and one can quickly map charging non-uniformities across the electrode.

Figure 11:
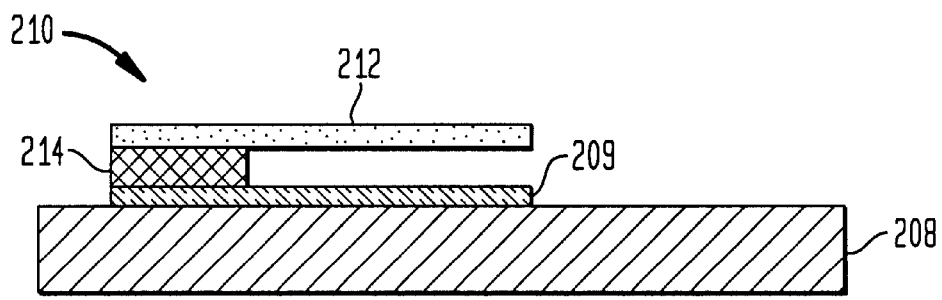
FIG. 11 is a perspective view of a conductive layer placed over a portion of a non-conductive substrate.

As described herein, it has been assumed that a conducting or semiconducting substrate is used. If the substrate is insulating, such as glass, the sensor could be fabricated on top of a conductive coating placed over a portion of the substrate. This is shown in FIG. 11, wherein the microcantilever 210 includes a beam 212 extending from an insulator 214. A conducting layer 209 is positioned over the insulating substrate 208, and the beam 212 extends over conducting layer 209.

EXPERIMENT

The charging voltage in a parallel-plate reactive-ion-etching (RIE) reactor has been measured by both techniques. The electrode diameter is 24 cm and spacing between the electrodes is 5 cm. The gases are injected into the chamber through a shower head in the top electrode. All experiments were done in an Oxygen or Argon plasma with RF frequency being 13.56 MHZ.

RESULTS

Figure 6A:
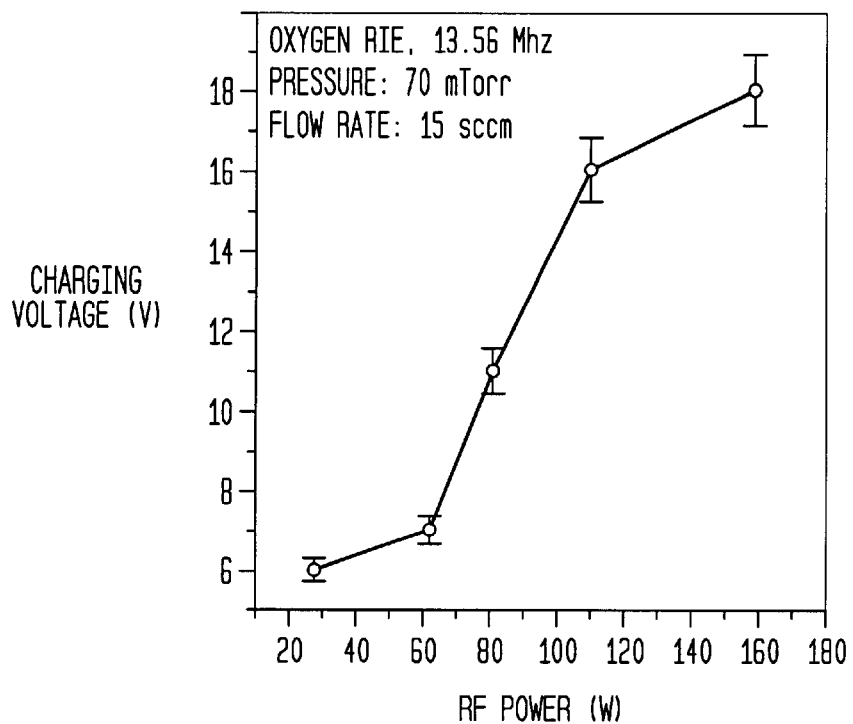
FIG. 6a shows a plot of charging voltage versus RF input power with constant chamber pressure, and constant flow rate of oxygen.
Figure 6B:
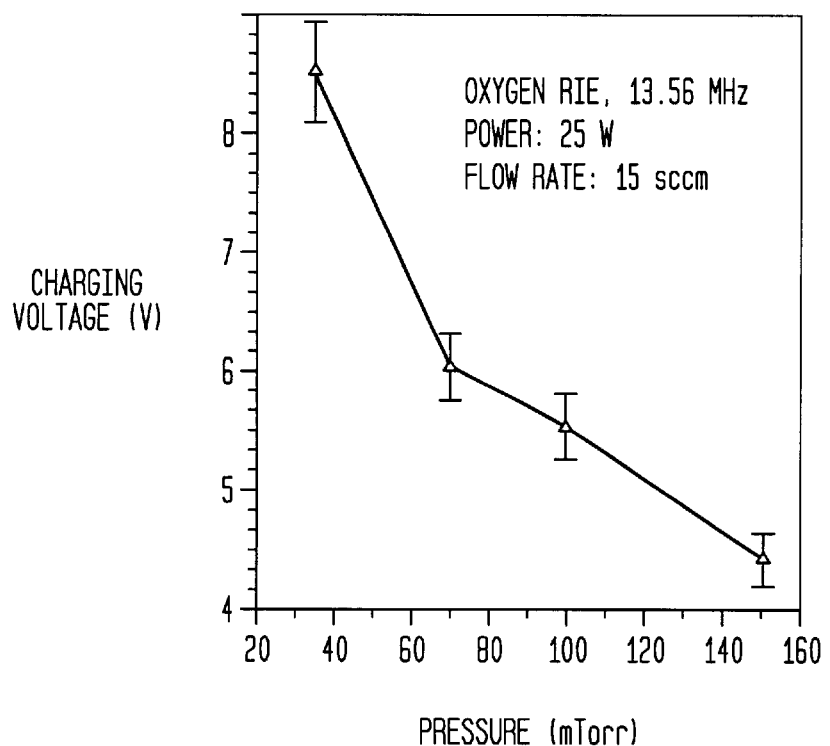
FIG. 6b shows a plot of charging voltage versus chamber pressure with both RF power and flow rate of oxygen held constant.
Figure 6C:
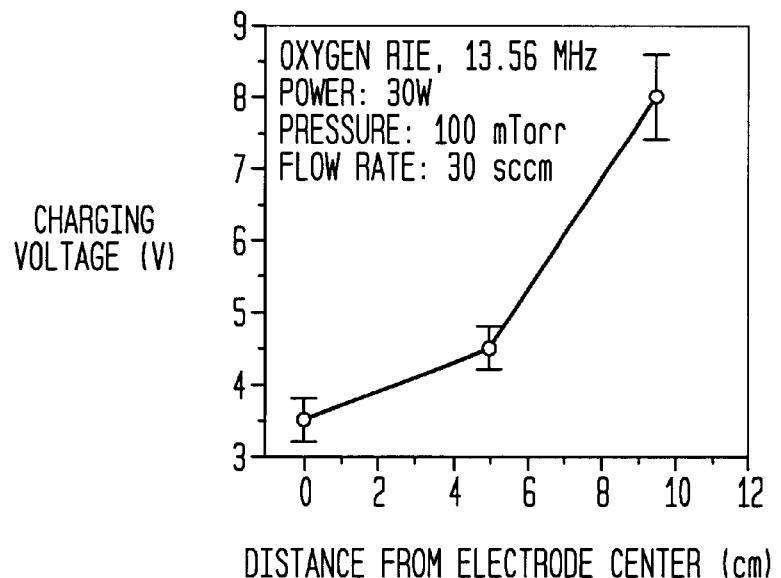
FIG. 6c shows a plot of charging voltage versus distance from the center of an electrode, where each of RF power, chamber pressure, and the flow rate of oxygen are held constant.
Figure 6D:
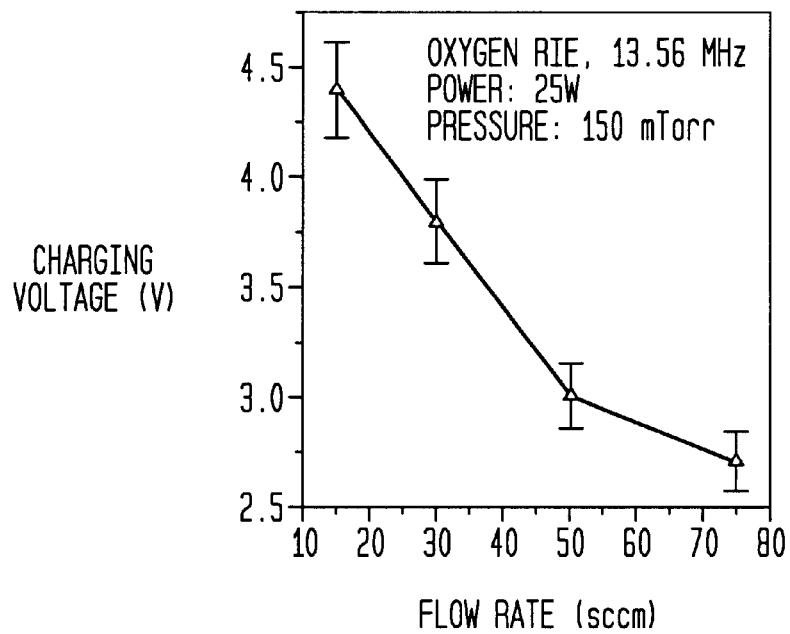
FIG. 6d shows a plot of charging voltage versus the flow rate of oxygen.

The charging voltage near the electrode edge (9.5 cm. from the center) is measured by the in situ technique. The charging voltage was found to increase as RF input power increased (see FIG. 6a), and charging voltage as large as 20 V was seen. The charging voltage decreased as the chamber pressure was increased (see FIG. 6b). These results clearly demonstrate the utility and versatility of the technique. Note that the voltages measured are sufficient to damage thin gate dielectrics (e.g. 50 nm oxide has a breakdown voltage of ~7 V). Charging voltages were also measured at the different points on the electrode by the ex-situ method. The charging voltage was found to be lower at the center compared to that at the edge (see FIG. 6c). The charging voltage was also found to vary as the flow rate of the gas varied with charging voltage decreasing as the flow rate of oxygen increased at the electrode edge (see FIG. 6d).

Figure 7A:
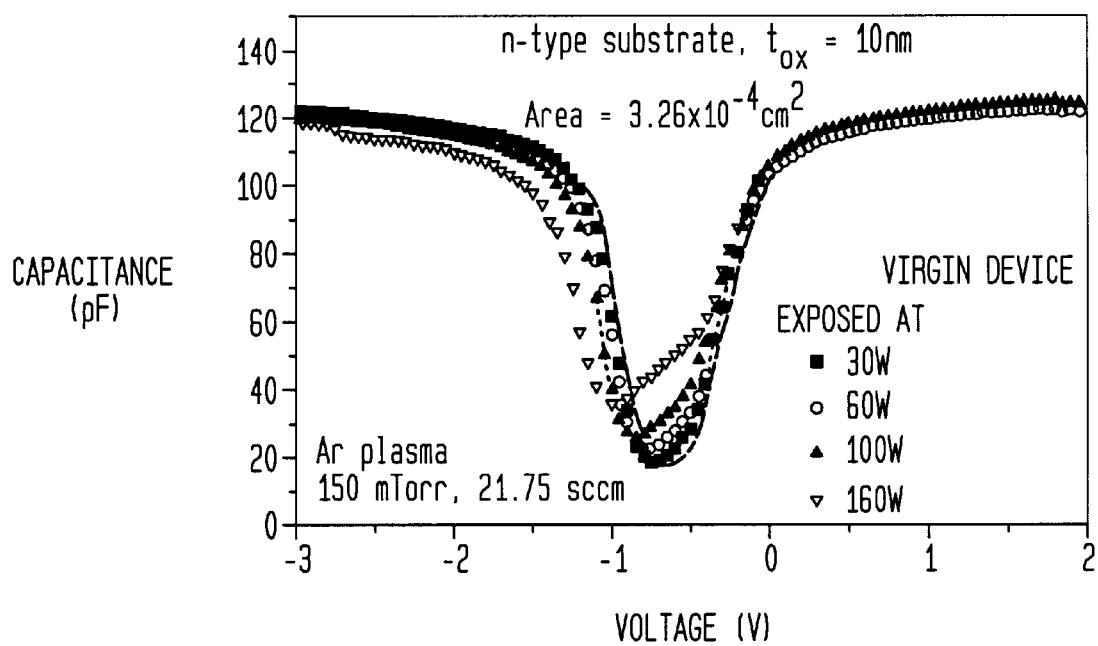
FIG. 7a is a plot of quasi-static C-V curves of devices exposed at varying rf powers for 1 min.
Figure 7B:
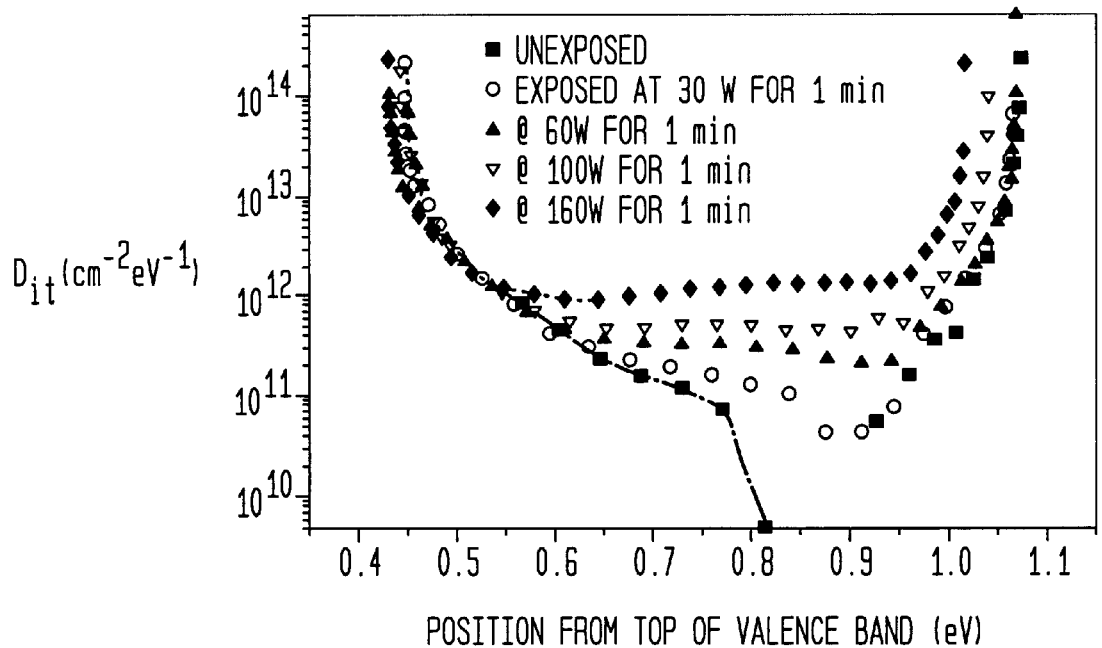
FIG. 7b is a plot of the corresponding interface state density as a function of position in the band gap.

When the MOS capacitors were exposed to plasma, varying the RF power, time of exposure and the chamber pressure, the quasi-static (QS) capacitors vs. voltage (C-V) was measured after a fixed interval of time (14 min.). The QS C-V curve reflected the degradation of the gate oxide and this degradation scaled with the sensor reading. FIG. 7a shows the QS C-V curves of various devices exposed to Argon plasma at different rf powers for one minute, and FIG. 7b shows the corresponding interface state density, clearly showing that the degradation of gate oxide scales with rf power.

Figure 8:
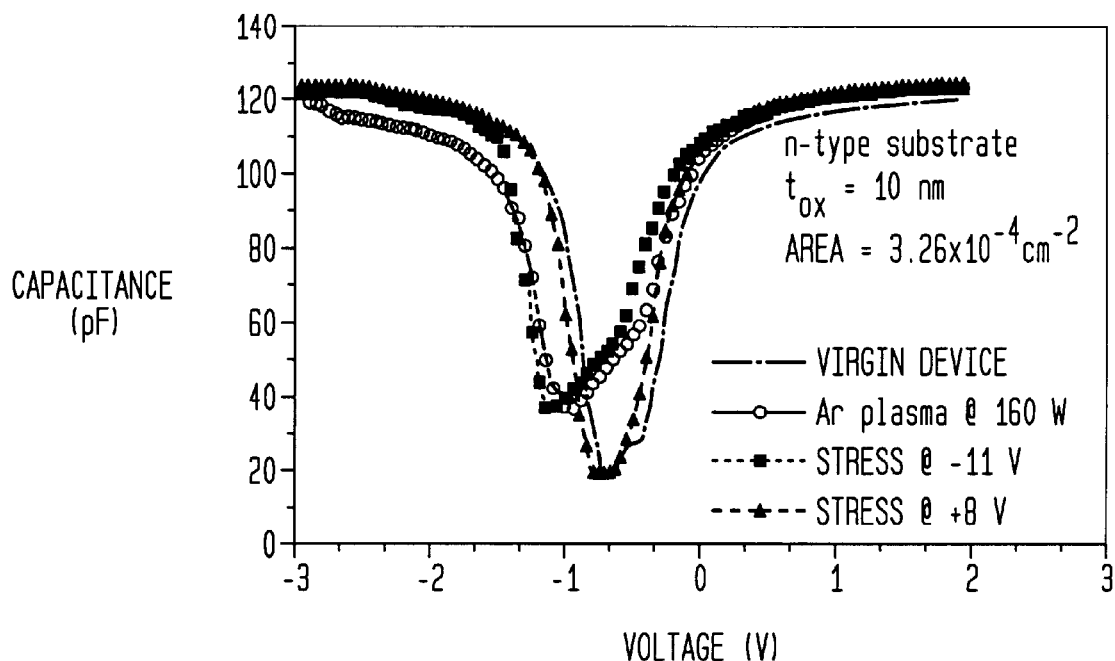
FIG. 8 is a comparison of QS C-V curves of devices exposed to plasma and DC bias stressed.
Figure 9:
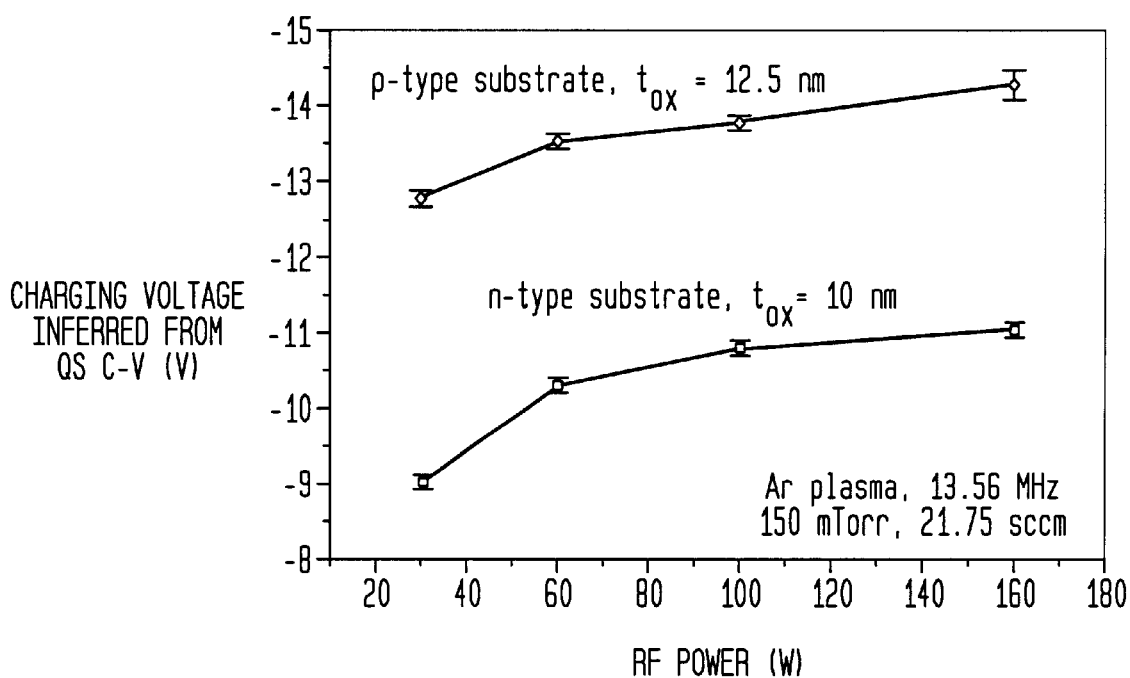
FIG. 9 is a plot of the changing voltage inferred from DC bias stressing and matching the QS C-V curves for n&p type substrate MOS capacitors.
Figure 10:
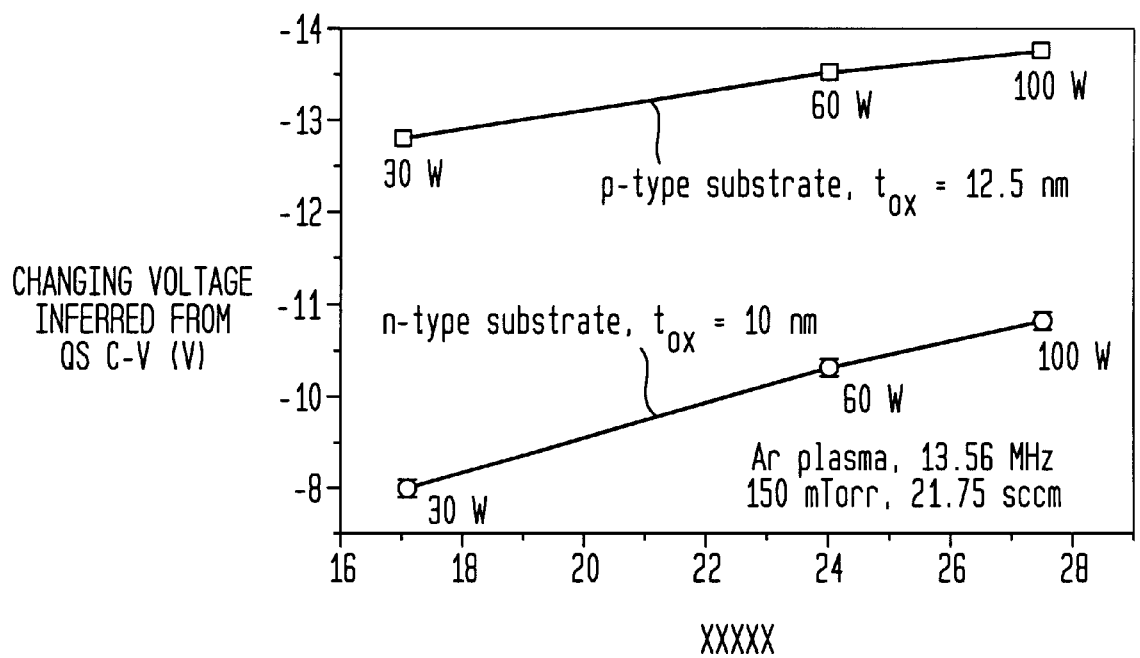
FIG. 10 is a comparison of charging voltage as measured by sensor and inferred from QS C-V degradation at different rf power.

By varying the DC stress, electrical voltage on the gate during plasma exposure could be estimated by comparing QS C-V curves. It was found that the negative bias stress on the gate gave QS C-V curve which must closely resemble that measured after plasma exposure (FIG. 8). Similar results were found from MOS capacitors with p-type substrates, and the plasma-induced voltage increased with oxide thickness as shown in FIG. 9. A comparison of the charging voltage as measured by the sensors at different plasma rf power and that inferred from the MOS capacitors is shown in FIG. 10. There is a direct one-to-one relation between the two measurements.

The main advantage of the present invention is that charging of insulator surfaces exposed to plasma can be detected in-situ without disturbing the plasma, unlike other probes. It requires no wires and can detect the charge ex-situ too if there are no optical ports. The technique is direct and there is no need for further processing to estimate charging in plasmas. The probe is location specific so that one can map the charging voltage across the electrode and thereby determine the degree of plasma non uniformity.

What is claimed is:

1. An apparatus for measuring charge on a surface of a substrate comprising:
    an insulating base positioned on the substrate being measured;
    a flexible support arm extending from the insulating base to over the substrate being measured;
    a rigid paddle extending from the support arm to over the substate being measured;
    wherein when a charge is formed on the rigid paddle, an opposite charge is formed on the substrate being measured causing the flexible support arm to bend and the rigid paddle to deflect towards the substrate being measured; and
    means for calculating the charge on the surface of the substrate being measured based on the deflection of the rigid paddle.

2. The apparatus of claim 1 wherein the substrate being measured comprises a semiconductor wafer.

3. The apparatus of claim 1 wherein the substrate being measured is an insulator and a conductive coating is positioned over a portion of the substrate being measured, the insulating base is positioned on the conductive coating, and the rigid paddle is positioned over the conductive coating.

4. The apparatus of claim 1 further comprising a light for reflecting off the rigid paddle for measuring the deflection of the rigid paddle.

5. The apparatus of claim 4 wherein the light comprises a laser.

6. The apparatus of claim 5 wherein the laser is directed at the paddle and the reflected light is projected onto a screen and a shift in the reflected laser spot corresponds to the charge on the substrate being measured.

7. The apparatus of claim 5 further comprising a light position detector for detecting the reflection of the light.

8. The apparatus of claim 1 further comprising a second flexible support arm extending from the base over the substrate measured and parallel to the first flexible support arm, the second flexible support arm interconnected with the rigid paddle.

9. The apparatus of claim 8 wherein the rigid paddle comprises a pol-Si material and the flexible support arms comprises $SiO_2$.

10. The apparatus of claim 8 wherein the rigid paddle has a length and a width, both of which are greater than the width of the flexible support arms.

11. The apparatus of claim 10 wherein the rigid paddle has a larger upper surface area than the flexible support arms.

12. A method for measuring charge on a surface of a semiconductor wafer within a plasma reactor during processing comprising:

positioning a plurality of insulating bases with flexible support arms and rigid paddles extending therefrom on the surface of the semiconductor wafer being measured so that the flexible support arms and rigid paddles extend over the surface being measured;

allowing a charge to form on the surface being measured based on charges on the flexible support arms and rigid paddles;

allowing the flexible support arms and rigid paddles to deflect towards the surface being measured based on an electrical attraction created by the charges;

measuring the deflection of the rigid paddles; and calculating the charge based on the deflection.

13. The method of claim 12 wherein the step of measuring the rigid paddles comprises reflecting a light off of the rigid paddles to a light position detector.

14. The method of claim 12 wherein measuring the deflection comprises measuring the change in an angle of reflected light from a light source reflected off the rigid paddles.

15. The method of claim 12 wherein measuring the deflection comprises measuring diffraction of relected light of a light source directed at the rigid paddles.

16. The method of claim 12 wherein the step of measuring the deflection of the rigid paddles comprises visually inspecting the rigid paddles.

17. The method of claim 12 wherein the plurality of rigid paddles vary in size.

18. The method of claim 12 further allowing the rigid paddles to deflect to such an extent so as to contact the surface being measured and stick thereto.

19. The method of claim 18 further comprising visually inspecting the stuck paddles.

20. The method of claim 12 wherein the surface is non-conductive and the method further comprises placing a conductive layer over a portion of the substrate being measured prior to positioning a plurality of insulating bases thereon.

21. The method of claim 12 further comprising calibrating the deflection of the paddles by applying a known voltage to the surface being measured.

* * * * *

UNITED STATES PATENT AND TRADEMARK OFFICE
CERTIFICATE OF CORRECTION

PATENT NO. : 6,300,756 B1
DATED : October 9, 2001
INVENTOR(S) : Sturm et al.

Page 1 of 1

It is certified that error appears in the above-identified patent and that said Letters Patent is hereby corrected as shown below:

<u>Column 1,</u>
Following line 6, please add the following section:

-- GOVERNMENT RIGHTS
The present invention has been sponsored by the Pennsylvania State University Subcontract No. USAF-TPSU-PU-1464-967 (Prime Air Force Contract No. F33615-94-1-1464), and the government may have certain rights to the subject invention. --

Signed and Sealed this

Twenty-first Day of May, 2002

Attest:

*Attesting Officer*

JAMES E. ROGAN
*Director of the United States Patent and Trademark Office*